(12) United States Patent
Anbai et al.

(10) Patent No.: US 7,670,138 B2
(45) Date of Patent: Mar. 2, 2010

(54) QUARTZ-PRODUCT BAKING METHOD AND QUARTZ PRODUCT

(75) Inventors: Katsuhiko Anbai, Oshu (JP); Masayuki Oikawa, Oshu (JP); Masato Kadobe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 221 days.

(21) Appl. No.: 11/813,000

(22) Filed: Jun. 22, 2007

(65) Prior Publication Data
US 2008/0044785 A1 Feb. 21, 2008

(30) Foreign Application Priority Data
Jun. 23, 2006 (JP) ............................. 2006-174660

(51) Int. Cl.
*F27D 5/00* (2006.01)
(52) U.S. Cl. ............................. 432/239; 432/6; 432/258
(58) Field of Classification Search ...................... 432/6, 432/239, 241, 247, 253, 258; 211/41.18
See application file for complete search history.

(56) References Cited

U.S. PATENT DOCUMENTS

| | | | | |
|---|---|---|---|---|
| 5,445,522 A | * | 8/1995 | Miyagi et al. ................ | 432/156 |
| 5,516,283 A | * | 5/1996 | Schrems ...................... | 432/241 |
| 5,603,875 A | * | 2/1997 | Giller et al. .................. | 264/607 |
| 5,741,131 A | * | 4/1998 | DeGeorge et al. ............ | 432/258 |
| 5,752,819 A | * | 5/1998 | Hansotte et al. ............. | 432/241 |
| 6,171,982 B1 | * | 1/2001 | Sato ............................ | 438/795 |
| 6,524,650 B1 | * | 2/2003 | Shimahara et al. ......... | 427/248.1 |
| 6,540,509 B2 | * | 4/2003 | Asano et al. ................. | 432/205 |
| 2002/0172908 A1 | * | 11/2002 | Minami et al. .............. | 432/253 |

* cited by examiner

*Primary Examiner*—Gregory A Wilson
(74) *Attorney, Agent, or Firm*—Smith, Gambrell & Russell, LLP

(57) ABSTRACT

The present invention is a quartz-product baking method for baking a first quartz product and a second quartz product to remove a metal contained therein, the first and second quartz products being to be loaded into a heat-processing apparatus for heat-processing a semiconductor substrate so that at least a part of each quartz product is brought into contact with a heat-processing atmosphere of the heat-processing apparatus, the quartz-product baking method comprising the steps of: with the use of a jig including a first jig element and a second jig element that are disengageably stacked in a tier-like manner, placing the first quartz product on the first jig element, stacking the second jig element on the first jig element, and placing the second quartz product on the second jig member; placing on a lid member the jig in which the quartz products are placed in a tier-like manner, elevating the lid member to load the jig into a baking vertical vessel through a lower opening thereof, and hermetically sealing the lower opening of the baking vertical vessel with the lid member; heating an atmosphere in the baking vertical vessel; and supplying a baking gas containing a hydrogen chloride gas and a gas for enhancing reactivity of the hydrogen chloride gas, into the baking vertical vessel.

14 Claims, 16 Drawing Sheets

QUARTZ-PRODUCT BAKING METHOD AND QUARTZ PRODUCT

FIELD OF THE INVENTION

The present invention relates to a quartz-product baking method, the quartz product being to be loaded into a heat-processing apparatus for heat-processing a semiconductor substrate so that at least a part of the quartz product is brought into contact with a heat-processing atmosphere of the heat-processing apparatus.

BACKGROUND ART

One of heat-processing apparatuses used in a semiconductor manufacturing process is a vertical heat-processing apparatus which is a heat-processing apparatus of a batch type. In the vertical heat-processing apparatus, a heating furnace is composed of a vertical reaction tube whose lower end is opened, and a heater surrounding an outside of the reaction tube. A wafer holder called "wafer boat" holding a plurality of semiconductor wafers (referred to as "wafer" herebelow) in a tier-like manner is loaded from the lower side of the reaction tube, and the heating furnace is hermetically sealed. Then, the wafers are subjected to a heat process. As the heat process, there are conducted an oxidation process, a diffusion process, a film-deposition process by a CVD, and so on.

Components of a heat-processing apparatus, such as a reaction tube, a wafer boat, and a heat-insulation unit (heat-retention unit), are generally made of quartz. These quartz products are obtained by subjecting a quartz ingot to various machining processes. During these machining processes, a metal contamination such as a copper contamination may occur because of contact between the quartz product and a machining tool or an influence of a working atmosphere. Since the quartz product is cleaned with a hydrofluoric acid by a manufacturing company (maker) of the quartz product, the copper on a surface of the quartz product will be removed in theory. However, in actual practice, since copper is difficult to be ionized, the copper dissolved in the hydrofluoric acid may again adhere to the surface of the product. As a result, there is a possibility that a slight amount of copper remains on the surface of the quartz product.

Quartz products delivered to a manufacturing company (maker) of a semiconductor device are assembled into a vertical heat-processing apparatus which is then delivered to a user. When a surface of the quartz product is contaminated with copper, although slightly, the following problem may take place. That is to say, when the user starts an operation of the apparatus to heat-process a wafer, the copper on the surface of the quartz product is heated to activate a molecular motion of the copper. Thus, some molecules are scattered in the heat-processing atmosphere, and adhere to the wafer to contaminate the same. In recent years, due to a thinner film and further miniaturization of a semiconductor device, the wafer contaminated with copper, although slightly, may affect electric properties of the semiconductor device to degrade throughput thereof.

On the other hand, JP2002-313787A (especially, claim 1, sections 0017 and 0027) describes that, after quartz products are assembled into a heat-processing apparatus and before an oxidation process starts, the quartz products are baked by a hydrogen chloride gas and an oxygen gas. However, this method is disadvantageous in that it takes a long time before an operation of the apparatus starts.

JP2002-313787A also describes that the quartz products are baked (subjected to a baking process) before the quartz products are assembled into a heat-processing apparatus. This process, i.e., baking the quartz products beforehand, is practically advantageous in reducing a time required for the user to start an operation of the apparatus. In this case, it is preferable that the quartz products of the vertical heat-processing apparatus, such as a reaction tube, a wafer boat, an insulation unit below the wafer boat, and a temperature sensor unit, are efficiently, uniformly baked by a user-friendly baking method. However, no concrete manner of the baking process is described in JP2002-313787A.

SUMMARY OF THE INVENTION

In view of the above disadvantages, the present invention has been made to effectively solve the same. The object of the present invention is to provide a baking method of easily, collectively baking a plurality of quartz products, in response to a demand for baking quartz products to be loaded into a heat-processing apparatus for heat-processing a semiconductor substrate so that at least a part of each quartz product is brought into contact with a heat-processing atmosphere of the heat-processing apparatus.

The present invention is a quartz-product baking method for baking a first quartz product and a second quartz product to remove a metal contained therein, the first and second quartz products being to be loaded into a heat-processing apparatus for heat-processing a semiconductor substrate so that at least a part of each quartz product is brought into contact with a heat-processing atmosphere of the heat-processing apparatus, the quartz-product baking method comprising the steps of: with the use of a jig including a first jig element and a second jig element that are disengageably stacked in a tier-like manner, placing the first quartz product on the first jig element, stacking the second jig element on the first jig element, and placing the second quartz product on the second jig member; placing on a lid member the jig in which the quartz products are placed in a tier-like manner, elevating the lid member to load the jig into a baking vertical vessel through a lower opening thereof, and hermetically sealing the lower opening of the baking vertical vessel with the lid member; heating an atmosphere in the baking vertical vessel; and supplying a baking gas containing a hydrogen chloride gas and a gas for enhancing reactivity of the hydrogen chloride gas, into the baking vertical vessel.

Concrete examples of the quartz products to be loaded into a heat-processing apparatus for heat-processing a semiconductor substrate so that at least a part of each quartz product is brought into contact with a heat-processing atmosphere of the heat-processing apparatus are a reaction vessel, a substrate holder, a heat-insulation unit, and a cover member on an upper side of a lid member for opening and closing a throat (furnace opening).

According to the above feature, a plurality of quartz products can be easily, collectively baked. The number of jig elements, i.e., the number of quartz products to be collectively baked, is not limited to two. For example, when small quartz products are baked, it is preferable to increase the number of jig elements so as to increase the number of quartz products to be collectively baked. On the other hand, when a larger component, such as a reaction vessel and a substrate holder, a height of the overall baking object(s) can be adjusted by decreasing the number of jig elements.

For example, each of the first jig element and the second jig element includes: jig element bodies that can be stacked on each other; and plates disposed on each of the jig element bodies, for placing thereon the quartz products.

The plate is, for example, capable of being engaged with and disengaged from the jig element body.

In addition, it is preferable that the plate is provided with a hole for allowing a gas to pass therethrough.

In addition, the jig element body is, for example, a cylindrical body. In this case, it is preferable that a plurality of gas-passing holes for allowing a gas to pass therethrough are formed in a peripheral wall of the jig element body in a circumferentially dispersed manner. With this structure, stagnation of the gas can be prevented so that the gas can smoothly flow. Thus, the quartz products placed on the jig elements can be uniformly baked. In this case, it is further preferable that an inner diameter of the jig element body is nearly identical to an inner diameter of the baking vertical vessel.

For example, a quartz product can be placed on an uppermost jig element such that the quartz product projects upward from the uppermost jig element. To be specific, as a quartz product, a reaction vessel or a substrate holder of the heat-processing apparatus can be placed on the uppermost jig element.

In addition, the present invention is a quartz product that is to be loaded into a heat-processing apparatus for heat-processing a semiconductor substrate so that at least a part of the quartz product is brought into contact with a heat-processing atmosphere of the heat-processing apparatus, the quartz product having been baked by the baking method having any of the above-described features.

Further, the present invention is a set of quartz products that is to be loaded into a heat-processing apparatus for heat-processing a semiconductor substrate so that at least a part of each quartz product is brought into contact with a heat-processing atmosphere of the heat-processing apparatus, the set of quartz products having been simultaneously baked by the baking method having any of the above-described features.

Furthermore, the present invention is a quartz-product baking apparatus for baking a first quartz product and a second quartz product to remove a metal contained therein, the first and second quartz products being adapted to be loaded into a heat-processing apparatus for heat-processing a semiconductor substrate so that at least a part of each quartz product is brought into contact with a heat-processing atmosphere of the heat-processing apparatus, the quartz-product baking apparatus comprising: a jig including a first jig element and a second jig element that are disengageably stacked in a tier-like manner; a lid member for placing thereon the jig and the quartz products, with the first quartz product being placed on the first jig element, the second jig element being stacked on the first jig element; and the second quartz product being placed on the second jig element; a baking vertical vessel having a lower opening that is closed by the lid member; a heating device for heating an atmosphere in the baking vertical vessel; and a gas-supplying device for supplying a baking gas containing a hydrogen chloride gas and a gas for enhancing reactivity of the hydrogen chloride gas into the baking vertical vessel.

DETAILED DESCRIPTION OF THE INVENTION

First Embodiment

A baking apparatus for carrying out a baking method in a first embodiment of the present invention will be described below.

Figure 1:
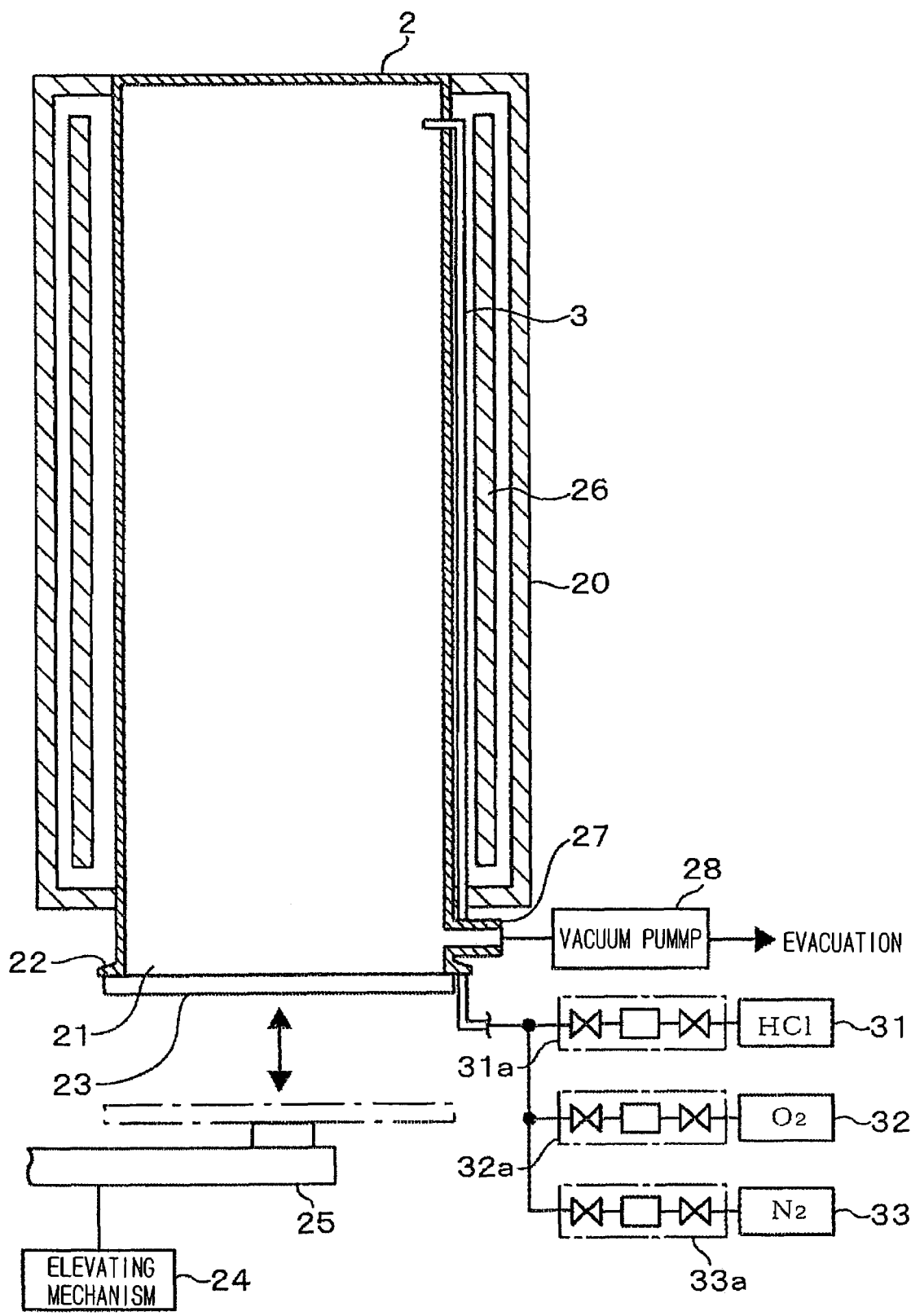
FIG. 1 is a schematic longitudinal sectional view of a baking apparatus in one embodiment of the present invention.

FIG. 1 is a schematic longitudinal sectional view of a baking apparatus in one embodiment of the present invention. The baking apparatus is an apparatus for baking quartz products placed on a baking jig which is described below.

As shown in FIG. 1, the baking apparatus in this embodiment includes a cylindrical vertical vessel 2 made of non-metal such as quartz. A lower end of the vertical vessel 2 is opened to form a loading/unloading port (throat). A flange 22 is integrally formed with the vertical vessel 2 at a periphery of the opening 21. A lid member 23 made of, e.g., quartz, is disposed below the vertical vessel 2. When the lid member 23 is brought into contact with a lower surface of the flange 22, the opening 21 can be hermetically sealed by the lid member 23. The lid member 23 can be vertically moved by an elevator 25 capable of being elevated by an elevating mechanism 24. A baking jig, which is described below, is placed on the lid member 23.

A cylindrical canister member 20 which has been cooled, for example, is disposed around the vertical vessel 2. Further, a heater 26 as heating means, e.g., a carbon wire heater, is arranged inside the canister member 20. Not limited to the carbon wire heater, the heater may be a metal body such as an iron-tantalum-carbon alloy. In addition, not limited to quartz, the vertical vessel 2 may be made of ceramics, for example.

An exhaust pipe 27 is connected to a lower side surface of the vertical vessel 2. A vacuum pump 28 as exhaust means is connected to a proximal end of the exhaust pipe 27. A baking gas and a purge gas supplied into the vertical vessel 2 can be discharged by the vacuum pump 28.

A gas-supply pipe (gas-supply part) 3, which serves as gas-supply means for supplying into the vertical vessel 2 a baking gas containing a hydrogen chloride gas and a gas for enhancing reactivity of the hydrogen chloride gas, is disposed at an upper lateral surface of the vertical vessel 2 to laterally project thereinto. The number of gas-supply pipe 3 is not limited to one, and the plurality of gas-supply pipes 3 may be circumferentially arranged on the vertical vessel 2 in series. As a gas for enhancing reactivity of the hydrogen chloride gas, it is preferable to select at least one or more than one gases from an oxygen, a water vapor, a nitrogen, a hydrogen, and an ozone.

In this embodiment, the other end (outside connecting part) of the gas-supply pipe 3 is diverged into three branching pipes. A hydrogen chloride (HCl) gas supply source 31, an oxygen ($O_2$) gas supply source 32, and a nitrogen ($N_2$) gas supply source 33 are respectively connected to the branching pipes. These branching pipes are provided with gas supply equipment groups 31a, 32a, and 33a, respectively. Thus, a hydrogen chloride gas, an oxygen gas, and a nitrogen gas can be independently supplied, with flow rates of these gases being adjusted. The nitrogen gas as an inert gas is used as a purge gas for purging the vertical vessel 2. Not limited to the nitrogen gas, another inert gas may be used as a purge gas. When an inert gas other than the nitrogen gas is used as a purge gas, it is necessary to additionally dispose supply means for supplying the inert gas. Specifically, each of the gas supply equipment groups 31a, 32a, and 33a is composed of, e.g., a valve, a mass flow controller, and so on.

In this embodiment, a combination of the oxygen gas and the nitrogen gas is selected as a gas for enhancing the hydrogen chloride gas. However, other combinations, such as a combination of the oxygen gas and the nitrogen gas, a combination of the hydrogen gas and the nitrogen gas, a combination of the water vapor and the nitrogen gas, and a combination of the water vapor and the oxygen gas, may be taken as examples as a combination of gases for enhancing the hydrogen chloride gas.

Next, an example of a heat-processing apparatus equipped with a quartz product that has been baked by the above-described baking apparatus is described with reference to FIG. 2. The heat-processing apparatus shown in FIG. 2 includes a vertical reaction tube 4 made of quartz as a baked quartz product. Wafers W can be arranged inside the reaction tube 4. Namely, the reaction tube 4 defines a heat-processing atmosphere of the wafers W. A lower end of the reaction tube 4 is opened. The lower opening can be opened and closed by a quartz lid member 41 capable of vertically moving. The quartz lid member 41 is also a baked quartz product.

An upper end of the reaction tube 4 provides an exhaust part 40 having a narrower diameter. The exhaust part 40 is bent and a distal end thereof forms an exhaust port 40a.

A wafer boat (substrate holder) 43 made of quartz capable of holding a plurality of substrates, e.g., 25 to 50 wafers W in a tier-like manner is disposed on the lid member 41 via a heat-insulation unit 42. An L-shaped injector 44 made of quartz, which is extended upward in the reaction tube 4, is inserted from a side surface of the reaction tube 4 near a lower end thereof. A cylindrical canister member 4a is disposed around the reaction tube 4. The canister member 4a is provided with a heater (not shown) for heating an atmosphere in the reaction tube 4.

Next, with reference to FIGS. 3 and 4, a baking jig for loading a quartz product into the baking vertical vessel 2 is described below.

Figure 3:
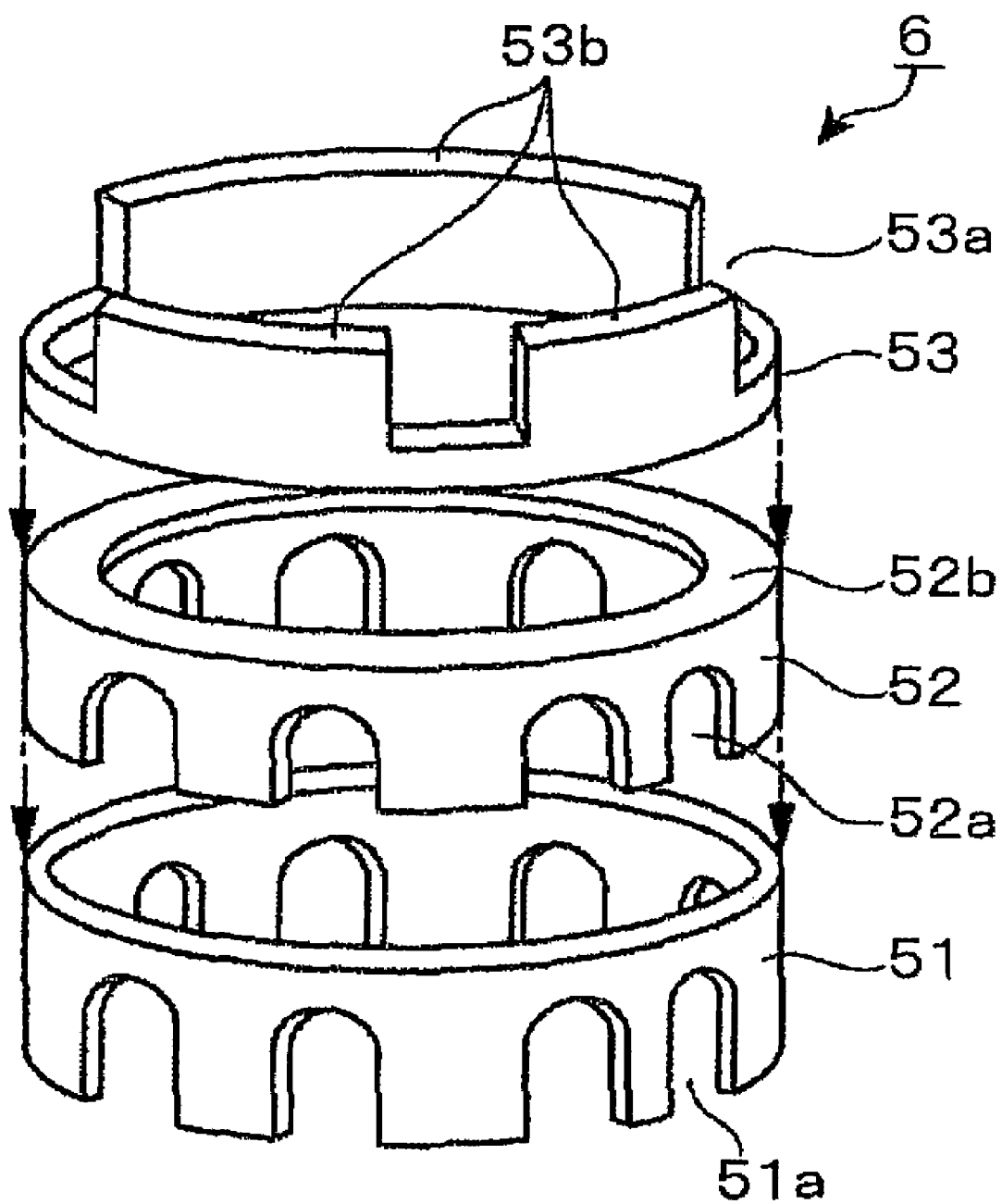
FIG. 3 is a schematic perspective view of a baking jig in the baking apparatus in one embodiment of the present invention.
Figure 4:
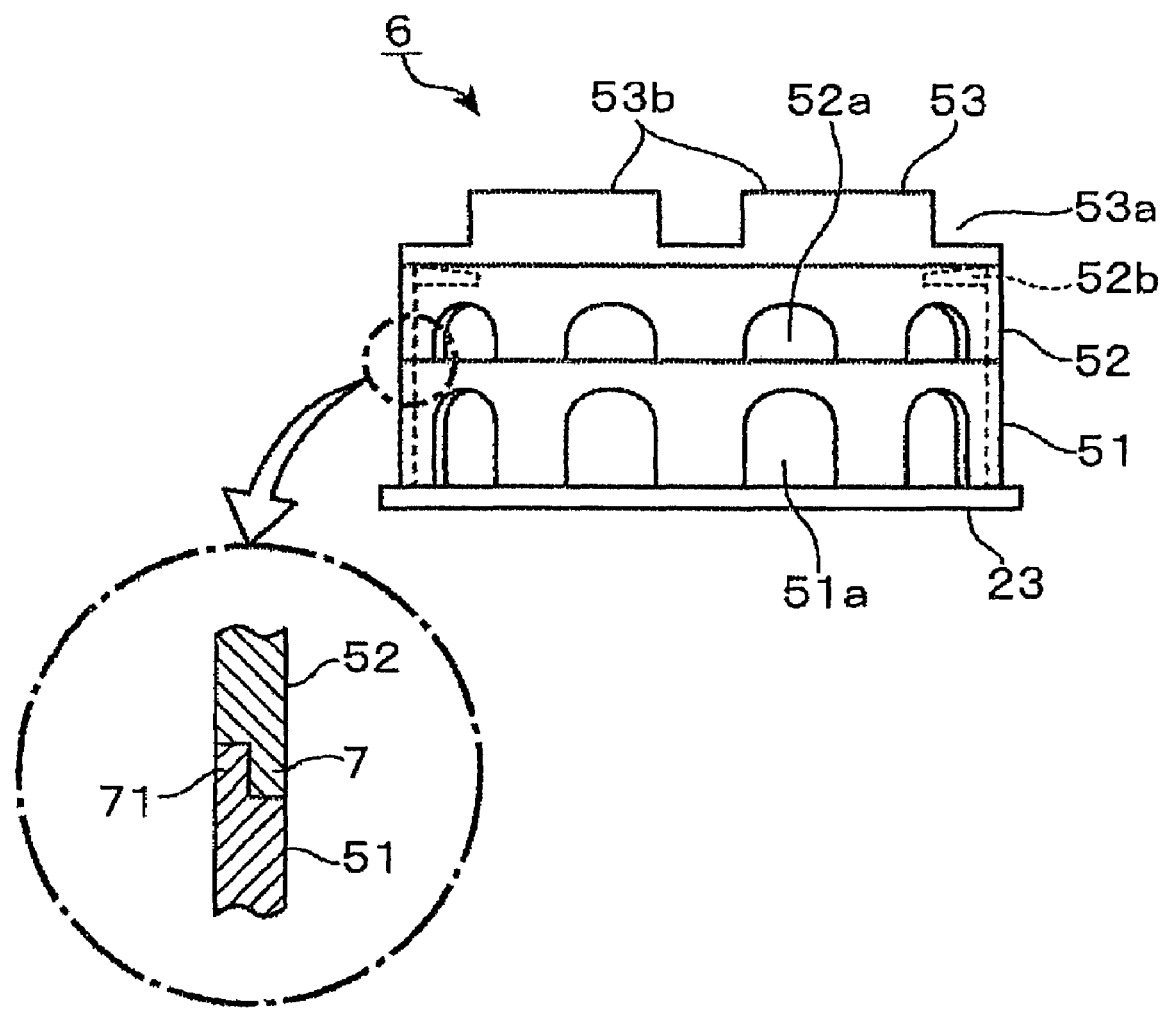
FIG. 4 is a schematic front view of the baking jig shown in FIG. 3.

The baking jig 6 shown in FIGS. 3 and 4 is formed by stacking three cylindrical members (cylindrical bodies) 51, 52, and 53. These cylindrical members 51, 52, and 53 are disengageably stacked in a tier-like manner as jig elements. Each of the outer diameters of the cylindrical members 51, 52, and 53 is smaller than an inner diameter of the vertical vessel 2 by 20 mm to 60 mm, for example.

As shown in FIGS. 3 and 4, circumferential walls of the first cylindrical member 51 and the second cylindrical member 52 are respectively provided at lower edges thereof with holes 51a and 52a of a semicircular shape or a U-shape for allowing a baking gas to pass therethrough. In this embodiment, the number of holes 51a and 52a are respectively eight. A ring-shaped support part 52b is circumferentially formed on an upper end surface of the second cylindrical member 52. The uppermost cylindrical member 53 is circumferentially provided with a plurality of, e.g., three standing pieces 53b. In the uppermost cylindrical member 53, each gap between the adjacent standing pieces 53b provides a hole 53a for allowing a baking gas to pass therethrough.

As shown in FIG. 4, a staged portion 7 is formed on a lower end surface of the second cylindrical member 52. The staged portion 7 is adapted to be engaged with a staged portion 71 formed on an upper end surface of the first cylindrical member 51, so that the first cylindrical member 51 and the second cylindrical member 52 can be fitted together. The uppermost cylindrical member 53 and the second cylindrical member 52 can be also fitted together by the same structure.

Figure 5:
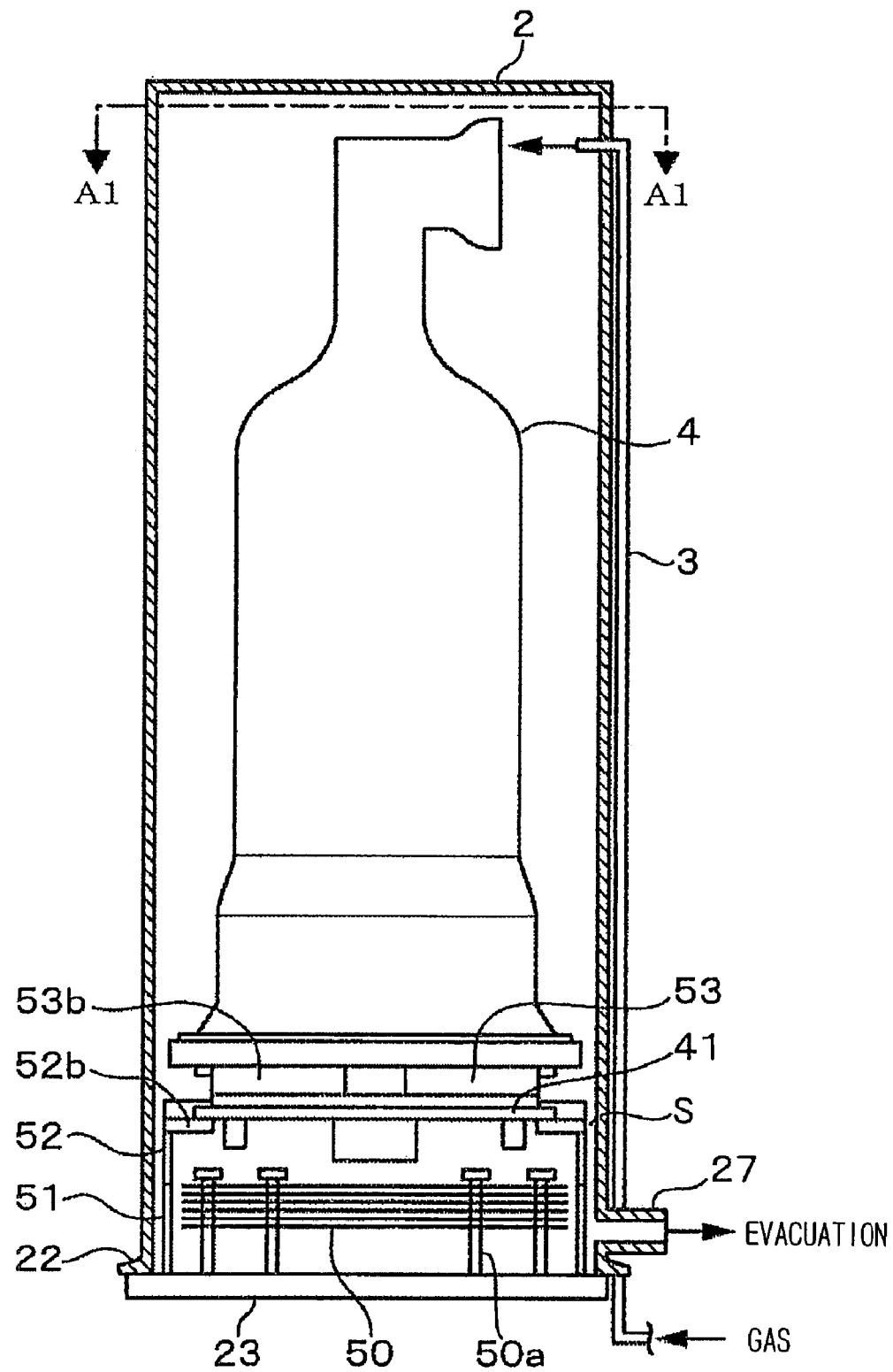
FIG. 5 is a view illustrating that the baking jig shown in FIG. 3 on which quartz products are placed is loaded in the baking apparatus.

FIG. 5 is a view illustrating that the baking jig shown in FIG. 3 on which quartz products are placed is loaded in the baking apparatus. In this embodiment, as shown in FIG. 5, the first cylindrical member 51 is placed on the lid member 23 of the baking apparatus. Next, on the cylindrical member 51, the second cylindrical member 52 is placed. Next, on the ring-shaped support part 52b formed on the upper end surface of the second cylindrical member 52, there is placed the lid member 41 as a quartz product to be baked. To be specific, a peripheral portion of the lid member 41 is supported by the ring-shaped support part 52b. On the cylindrical member 52 on which the lid member 41 is placed, the uppermost cylindrical member 53 is placed. On the circumferentially formed standing pieces 53b, there is placed the reaction tube 4 as a quartz product to be baked. Specifically, a lower flange part of the reaction tube 4 is supported by the three standing pieces 53b.

As shown in FIG. 5, the exhaust port 40a at the upper end of the reaction tube 4 is positioned such that the exhaust port 40a is opposed to the gas-supply pipe 3 projecting from the upper side surface of the vertical vessel 2. Thus, a baking gas having been supplied into the vertical vessel 2 through the gas-supply pipe 3 enters the reaction tube 4 via the upper-end exhaust port 40a to flow downward in the reaction tube 4.

Figure 6:
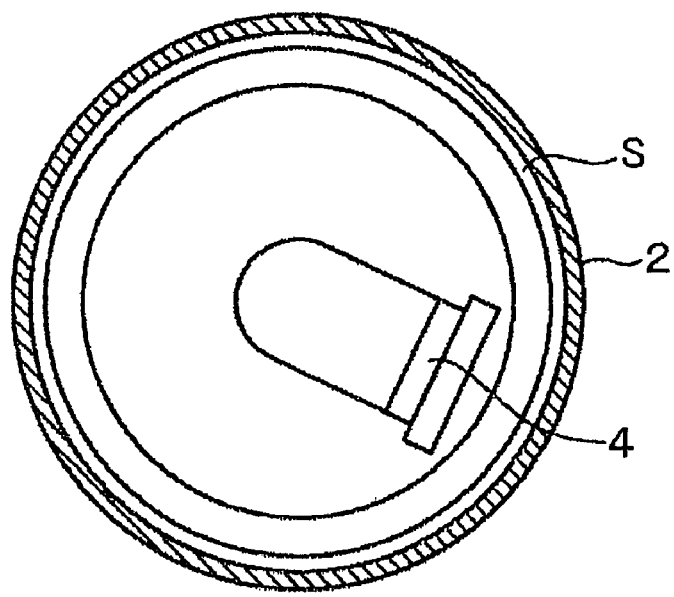
FIG. 6 is a sectional view taken along the line A1-A1 in FIG. 5.

As shown in FIG. 5, a plurality of heat-shield plates 50 are vertically disposed in a tier-like manner in a region surrounded by the first cylindrical member 51 and the second cylindrical member 52. The respective heat-shield plates 50 are supported by the lid member 23 via support members 50a, specifically, a plurality of grooves, not shown, formed in the support members 50a. FIG. 6 is a sectional view taken along the line A1-A1 of FIG. 5.

Figure 2:
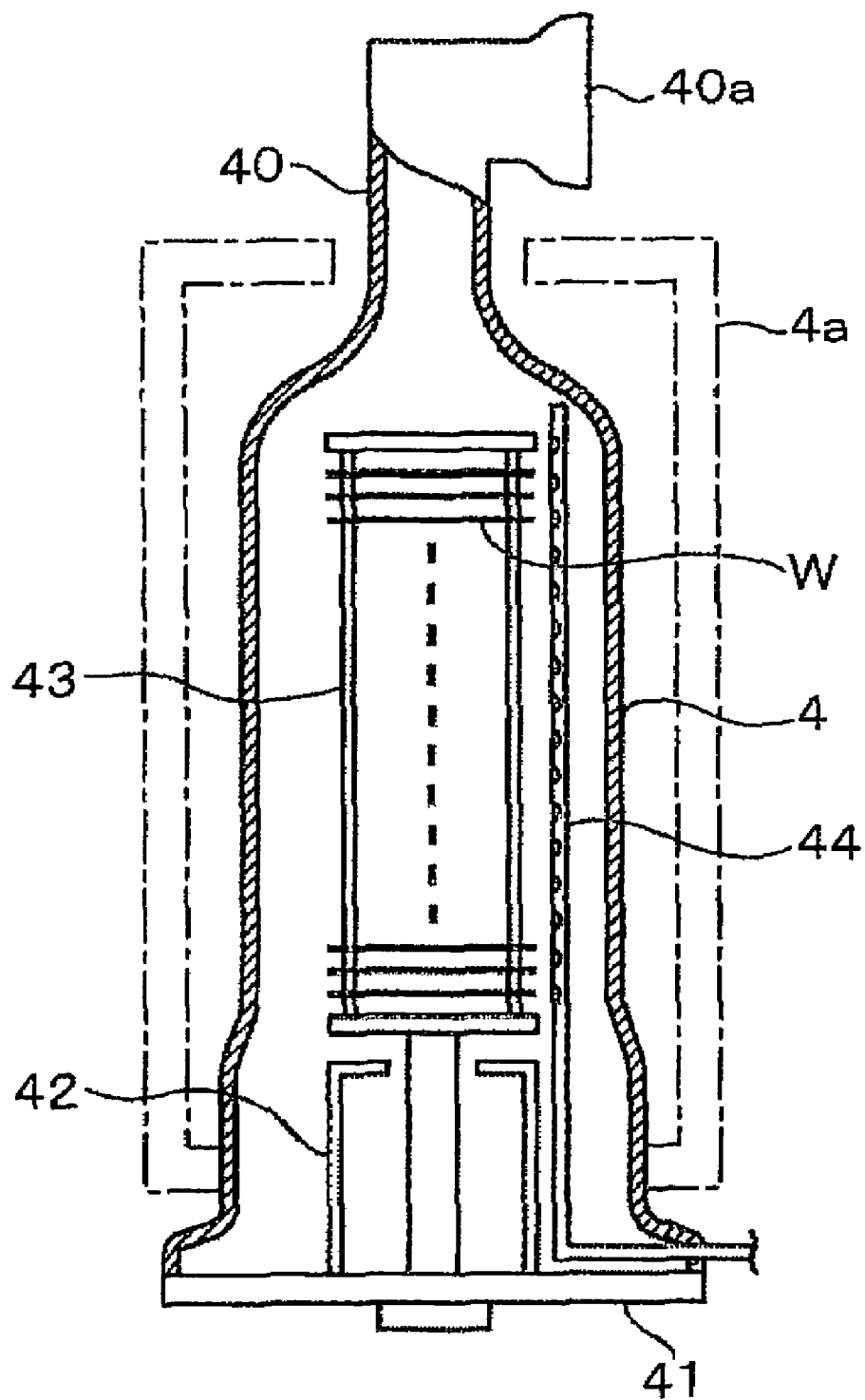
FIG. 2 is a schematic sectional view of an example of a vertical heat-processing apparatus for heat-processing wafers.

Next, there is described in detail a process for baking in an atmospheric pressure the quartz products constituting the heat-processing apparatus shown in FIG. 2, with the use of the baking apparatus shown in FIG. 1. In this embodiment, the reaction tube 4 and the lid member 41 shown in FIG. 2 are subjected to a baking process.

At first, the lid member 23 of the baking apparatus is set at a lowered position. Under this state, above the lid member 23, the cylindrical members 51, 52, and 53 as the jig elements are stacked and the quartz products are placed on the jig 6 as described above. Specifically, the reaction tube 4 and the lid member 41 are placed on the jig 6. By elevating the lid member 23, the jig 6 and the quartz products 4 and 41 are loaded into the vertical vessel 2. Then, the lower opening 21 is closed by the lid member 23, so that the vertical vessel 2 is hermetically sealed. The jig 6 is assembled (positioned) such that an exhaust port formed in the lower side surface of the vertical vessel 2 is opposed to the holes 51a, 52a, and 53a formed in the circumferential walls of the respective cylindrical members 51, 52, and 53.

Then, the valve in the gas supply equipment group 33a is opened to supply the nitrogen ($N_2$) gas into the vertical vessel 2 at a flow rate of 20 L/min, for example, so that the vertical vessel 2 is purged. Thereafter, a heating operation of the heater 26 is started to heat an atmosphere in the vertical vessel 2 at a predetermined temperature of, e.g., 800° C. to 1000° C.

Subsequently, the valve in the gas supply equipment group 31a is opened to supply the hydrogen chloride (HCl) gas into the vertical vessel 2 at a flow rate of 2 L/min, for example. At the same time, the valve in the gas supply equipment group 32a is opened to supply the oxygen ($O_2$) gas into the vertical vessel 2 at a flow rate of 8 L/min, for example.

The baking gas containing the hydrogen chloride gas and the oxygen gas for enhancing reactivity of the hydrogen chloride gas, which has been supplied into the vertical vessel 2, enters the reaction tube 4 via the upper-end exhaust port 40a and flows downward in the reaction tube 4. The baking gas having passed through the reaction tube 4 passes a clearance S (see, FIGS. 5 and 6) formed between outer circumferential walls 51, 52 and 53, and an inner circumferential wall of the vertical vessel 2. Then, the baking gas flows into the jig 6 via the holes 52a and 51a respectively formed in the circumferential walls of the second cylindrical member 52 and the first cylindrical member 51, or passes the jig 6 to again flow into the clearance S via the holes 52a and 51a.

Figure 7:
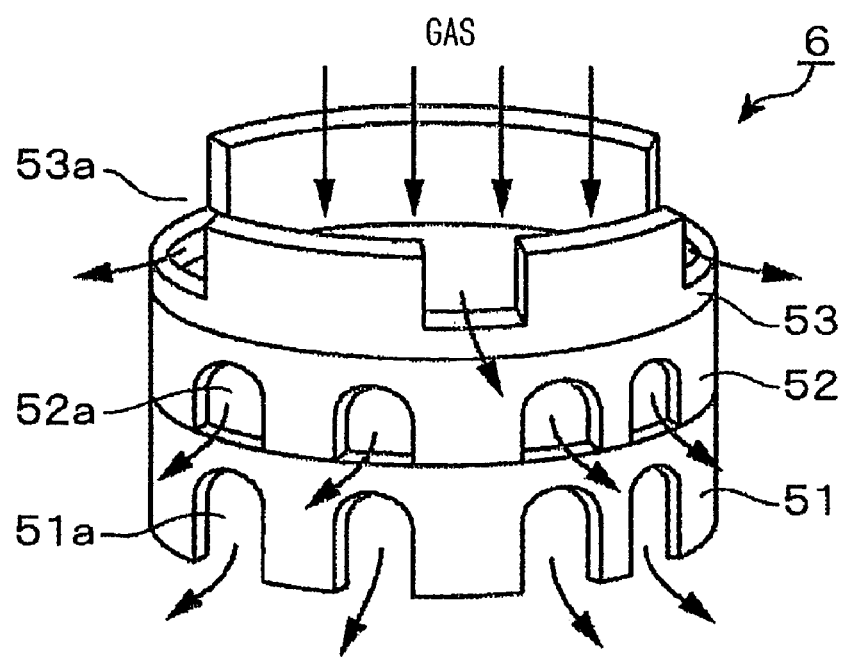
FIG. 7 is a view illustrating a flow of a gas through the baking jig shown in FIG. 3.

FIG. 7 is a view illustrating that the gas flows out of the holes 52a and 51a toward the clearance S. The baking gas having reached the lower end of the vertical vessel 2 passes through the clearance S to be discharged outside through the exhaust pipe 27 connected to the lower side surface of the vertical vessel 2.

In this manner, while the baking gas is being supplied into the vertical vessel 2, the baking process is performed for 3 to 20 hours, for example. Thus, a metal such as copper (Cu) contained in the inner circumferential surface of the reaction tube 4 and the surface of the lid member 41 reacts with the hydrogen chloride to become chloride salts. The chloride salts drop off from the quartz surface, and are discharged outside through the exhaust pipe 27 with being entrained with the baking gas.

After an elapse of a predetermined period of time, the valve in the gas supply equipment group 31a is closed to stop the supply of the hydrogen chloride gas. Simultaneously, a supply rate of the oxygen gas is set at 5 L/min to conduct an oxygen purge.

The oxygen purge may be conducted according to need. When the oxygen purge is conducted after the supply of the baking gas, the hydrogen chloride is oxidized to generate a chloride acid. Thus, it is possible to prevent that non-bonding hands in the quartz surface and the chloride acid are combined with each other to become impurities.

After the oxygen purge is finished, the valve in the gas supply equipment group 32a is closed to stop the supply of the oxygen gas. Then, the vertical vessel 2 is purged with nitrogen. Thereafter, the valve in the gas supply equipment group 33a is closed to stop the supply of the nitrogen gas. Following thereto, by stopping the heating operation of the heater 26, the vertical vessel 2 is naturally cooled at a normal temperature. After that, the lid member 23 is lowered and the jig 6 is unloaded from the vertical vessel 2, and the vertical vessel 2 is released from the hermetically sealed condition. When the lid member 23 reaches the lowered position, the jig 6 on the lid member 23 is disassembled and the reaction tube 4 and the lid member 41 are taken out. In this manner, the baking process is completed. These reaction tube 4 and the lid member 41 are then incorporated into a vertical heat-processing apparatus for heat-processing the wafer W.

According to the above-described first embodiment, the lid member 41 is placed on the second cylindrical member 52, the uppermost cylindrical member 53 is stacked thereon, and the reaction tube 4 is placed on the cylindrical member 53. Thus, the reaction tube 4 and the lid member 41 as quartz products can be collectively baked with the jig of such a simple structure. In addition, the loading operation of the quartz products into the jig and the unloading operation of the quartz products from the jig are significantly easy. The cylindrical members 51, 52, and 53 are formed of cylindrical bodies whose diameters are nearly identical to the inner diameter of the vertical vessel 2 as the baking furnace, and the gas-passing holes 51a, 52a, and 53a are formed in the circumferential walls of the cylindrical members 51, 52, and 53, respectively. Thus, stagnation of the gas can be prevented so as to achieve smooth flow of the gas. As a result, the reaction tube 4 and the lid member 41 placed on the cylindrical members 52 and 53 can be uniformly baked.

Second Embodiment

Next, another embodiment of the baking jig for loading a quartz product into the vertical vessel 2 will be described with reference to FIGS. 8 and 9. The same components shown in FIGS. 3 and 4 are indicated by the same reference numbers, and their description is omitted.

Figure 8:
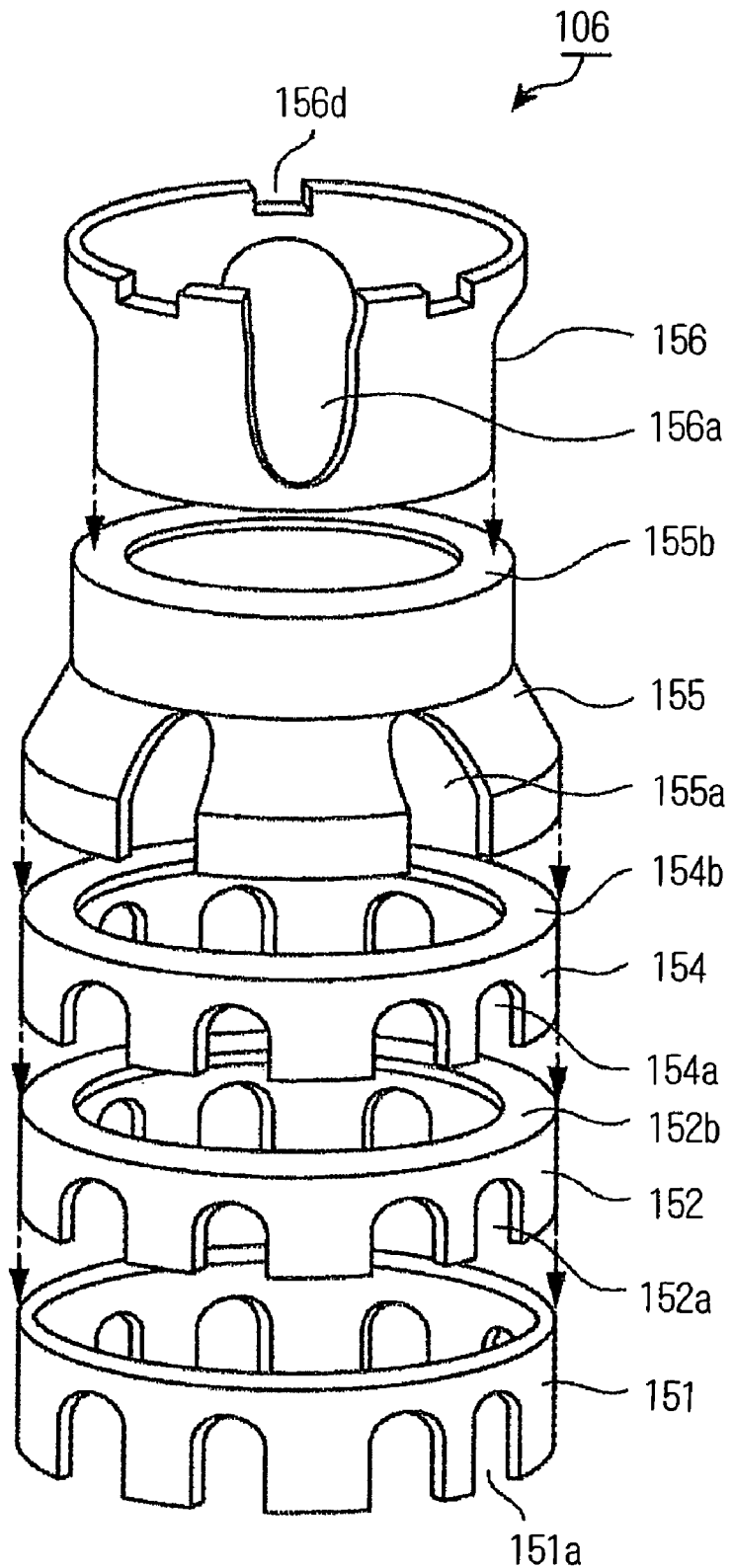
FIG. 8 is a schematic perspective view of a baking jig in another embodiment of the present invention.
Figure 9:
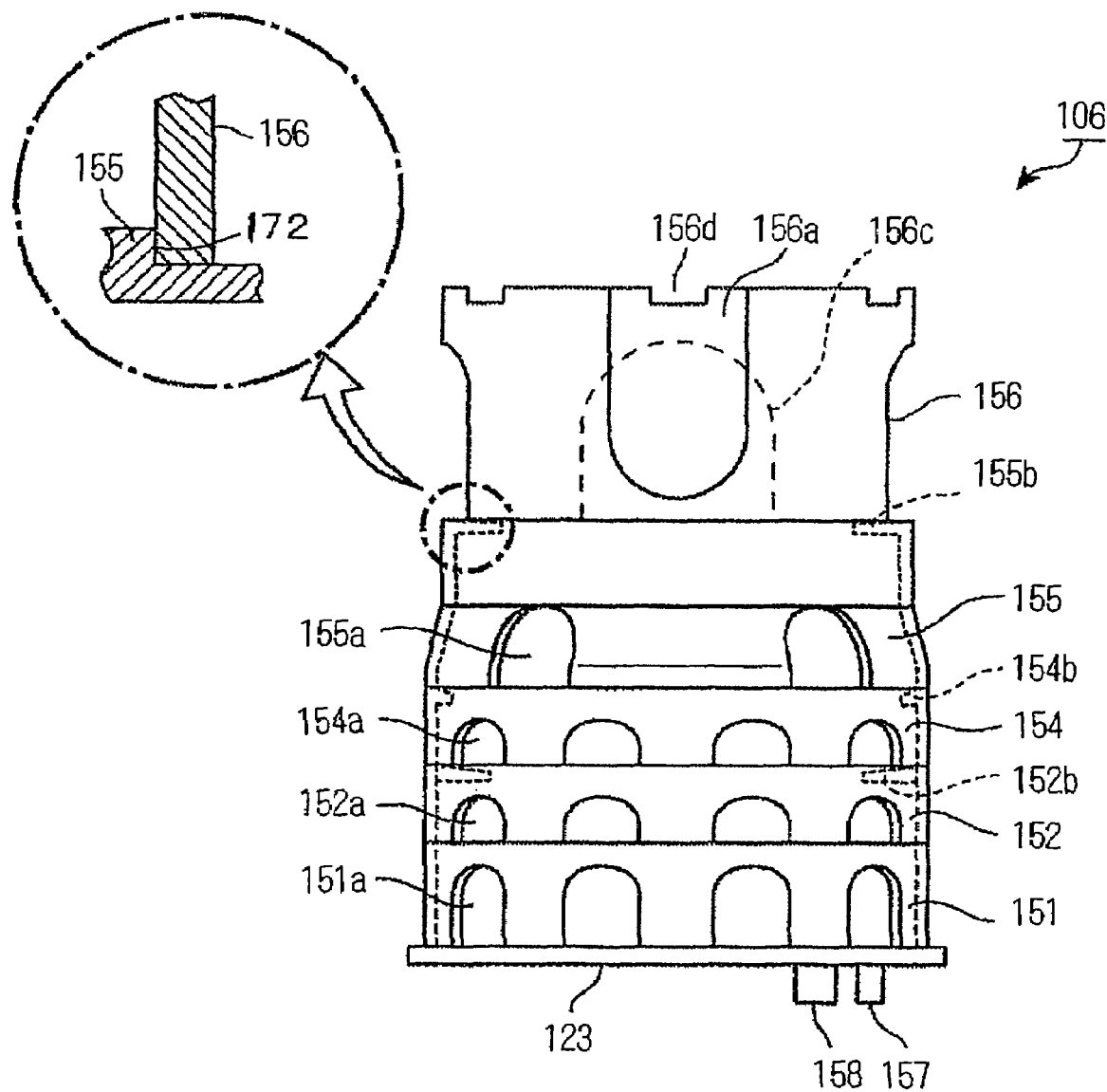
FIG. 9 is a schematic front view of the baking jig shown in FIG. 8.

A baking jig 106 shown in FIGS. 8 and 9 is formed by stacking five cylindrical bodies 151, 152, 154, 155, and 156. These cylindrical bodies 151, 152, 154, 155, and 156 are disengageably stacked in a tier-like manner as jig elements. The first to third cylindrical bodies 151, 152, and 154 have the same structure and dimensions as those of the cylindrical members 51, 52, and 53 in the first embodiment, and are provided with holes 151a, 152a, and 154a, respectively. A ring-shaped support part 154b is circumferentially formed on an upper end surface of the third cylindrical body 154. A plate 154c is placed on the ring-shaped support part 154b.

The fourth cylindrical body 155 is of a shape in which an upper opening thereof has a diameter slightly smaller than that of a lower opening. A ring-shaped support part 155b is circumferentially formed on an upper surface of the upper opening of a reduced diameter. A plate 155c is placed on the ring-shaped support part 155b. As shown in FIGS. 8 and 9, a circumferential wall of the cylindrical body 155 is provided at a lower edge thereof with holes 155a of a semicircular shape or a U-shape for allowing a baking gas to pass therethrough. In this embodiment, the number of holes 155a is four.

As shown in FIGS. 8 and 9, a circumferential wall of the uppermost cylindrical body 156 to be placed on the fourth cylindrical body 155 is provided at an upper edge thereof with one hole 156a of a semicircular shape or a U-shape for allowing a baking gas to pass therethrough. As shown in FIGS. 8 and 9, in the circumferential wall of the cylindrical body 156 at a position opposed to the hole 156a, there is formed, from a lower edge of the circumferential wall, one hole 156c of a semicircular shape or a U-shape for allowing a baking gas to pass therethrough. Further, a plurality of, e.g., three recesses 156d are circumferentially formed in an upper end surface of the uppermost cylindrical body 156.

As shown in FIG. 9, a staged portion 172 is circumferentially formed on the upper end surface of the fourth cylindrical body 155. The staged portion 172 receives the lower end surface of the uppermost cylindrical body 156. Similar to FIG. 4, the first cylindrical body 151 and the second cylindrical body 152 can be fitted together, the second cylindrical body 152 and the third cylindrical body 154 can be fitted together, and the third cylindrical body 154 and the fourth cylindrical body 155 can be fitted together.

Figure 10:
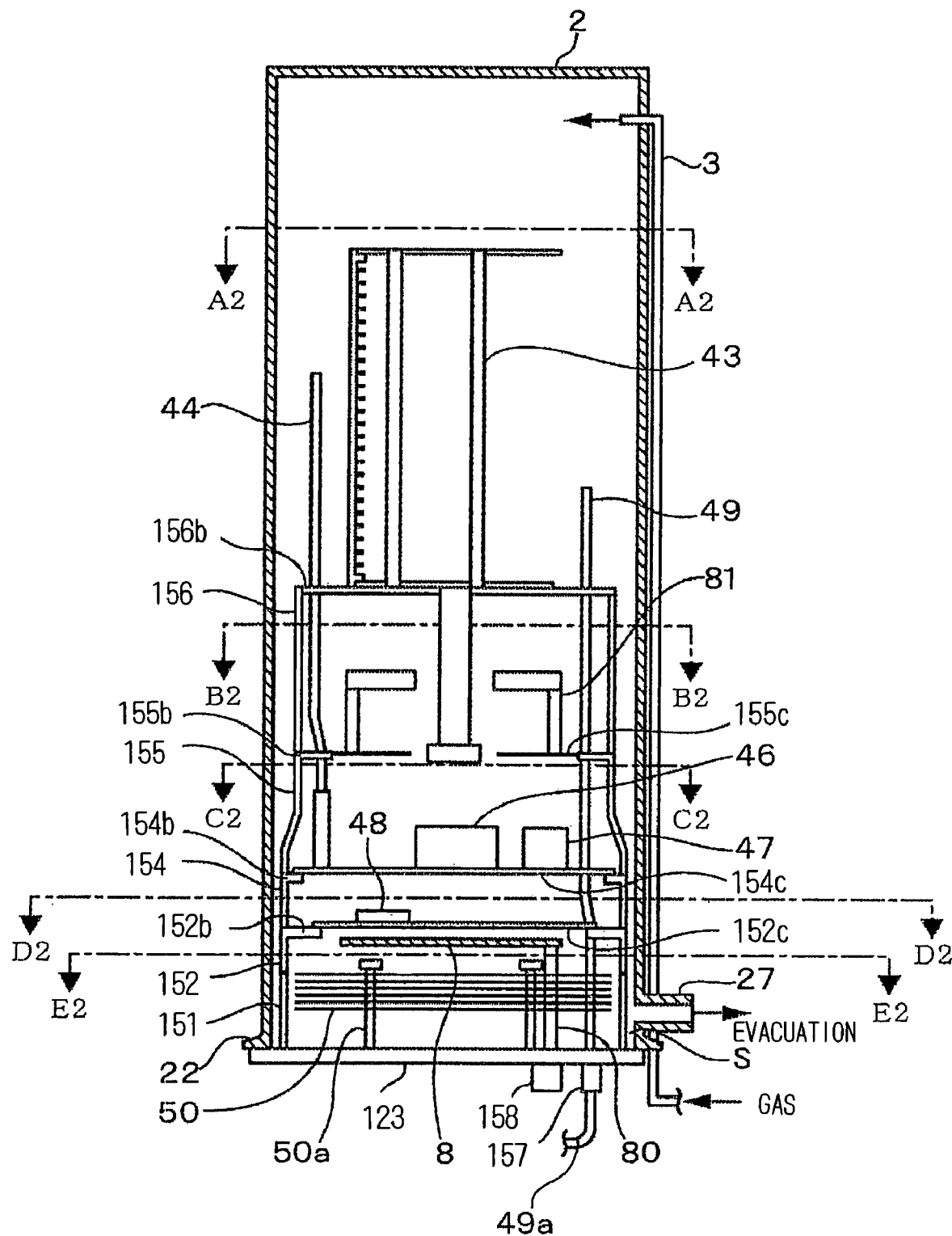
FIG. 10 is a view illustrating that the baking jig shown in FIG. 8 on which quartz products are placed is loaded in the baking apparatus.
Figure 11:
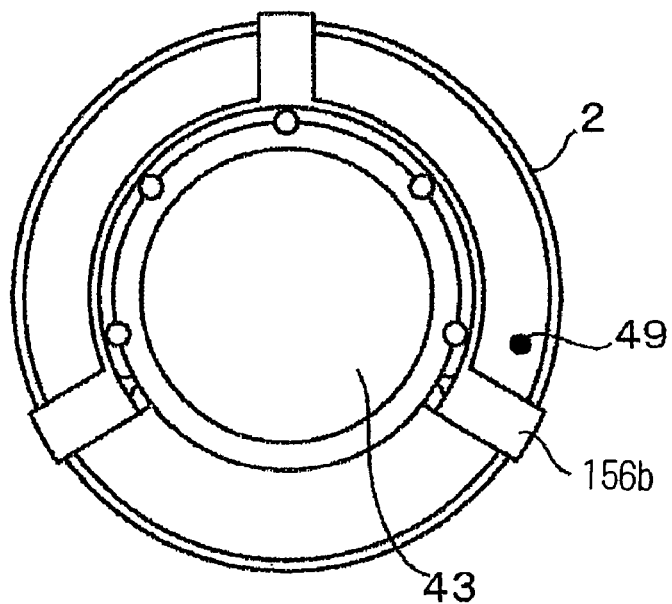
FIG. 11 is a sectional view taken along the line A2-A2 in FIG. 10.
Figure 12:
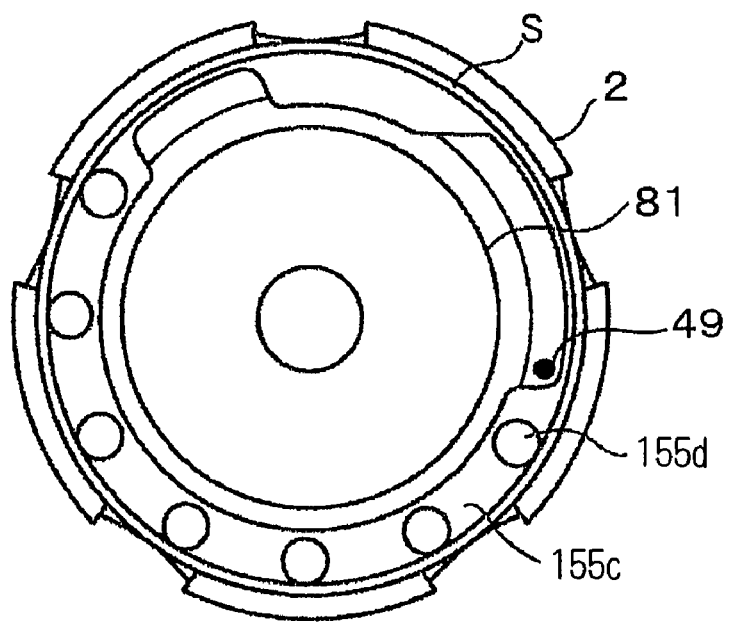
FIG. 12 is a sectional view taken along the line B2-B2 in FIG. 10.
Figure 13:
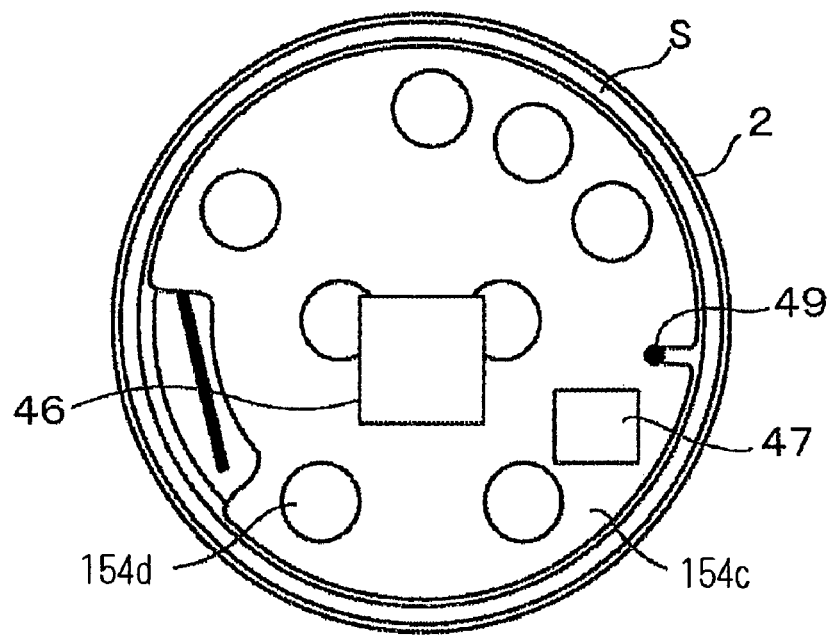
FIG. 13 is a sectional view taken along the line C2-C2 in FIG. 10.
Figure 14:
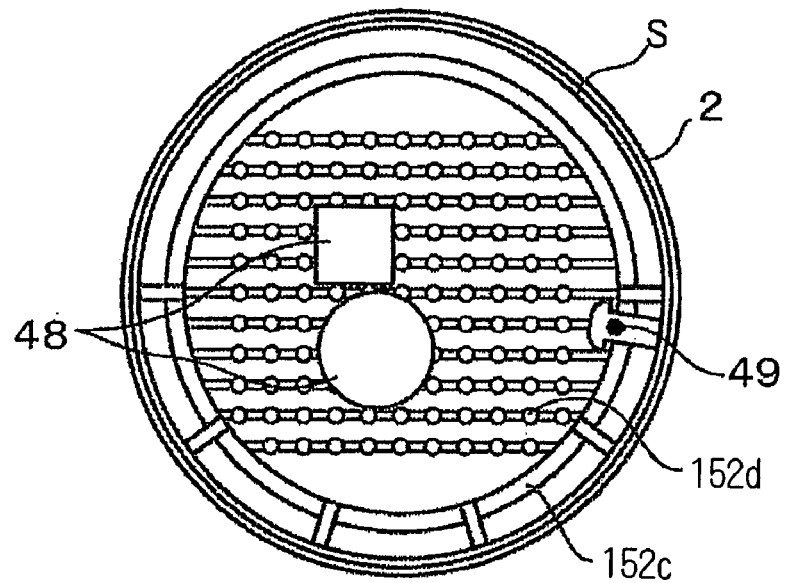
FIG. 14 is a sectional view taken along the line D2-D2 in FIG. 10.
Figure 15:
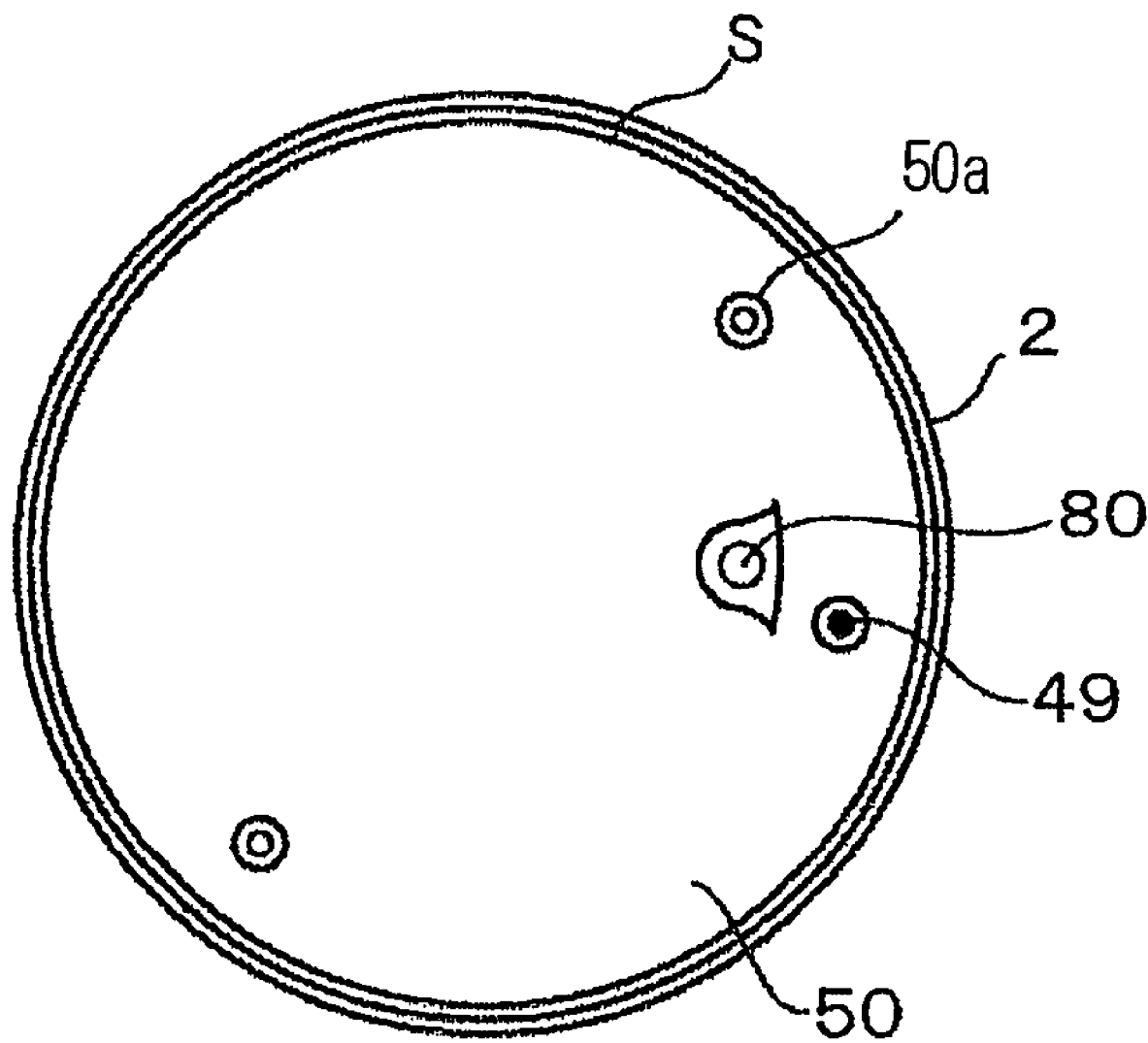
FIG. 15 is a sectional view taken along the line E2-E2 in FIG. 10.

FIG. 10 is a view illustrating that the baking jig 106 shown in FIG. 8 on which quartz products are placed is loaded in the baking apparatus. FIGS. 11 to 15 show respective sectional views of FIG. 10. To be specific, FIG. 11 is a sectional view taken along the line A2-A2 in FIG. 10, FIG. 12 is a sectional view taken along the line B2-B2 in FIG. 10, FIG. 13 is a sectional view taken along the line C2-C2 in FIG. 10, FIG. 14 is a sectional view taken along the line D2-D2 in FIG. 10, and FIG. 15 is a sectional view taken along the line E2-E2 in FIG. 10.

In this embodiment, as shown in FIG. 10, the first cylindrical body (cylindrical member) 151 is placed on a lid member 123 of the baking apparatus. Next, on the cylindrical body 151, the second cylindrical body (cylindrical member) 152 is placed. Next, on a ring-shaped support part 152b formed on the upper end surface of the second cylindrical body 152, there is placed a plate 152c on which small articles 48 as quartz products to be baked are placed.

Next, on the second cylindrical body 152, the third cylindrical body (cylindrical member) 154 is placed. On the ring-shaped support part 154b formed on the upper end surface of the third cylindrical body 154, there is placed the plate 154c. On the plate 154c, an injector 44 and tubular members 46 and 47 as quartz products to be baked are placed.

Next, on the third cylindrical body 154, the fourth cylindrical body 155 is placed. On the ring-shaped support part 155b formed on the upper end surface of the fourth cylindrical body 155, there is placed the plate 155c having a large opening at a center thereof. As shown in FIG. 12, on the plate 155c, there is placed a heat-insulation member 81 (forming a heat-insulation unit 42) as a quartz product to be baked.

Next, on the fourth cylindrical body 155, the uppermost cylindrical body 156 is placed. As shown in FIG. 11, on an upper end surface of the uppermost cylindrical body 156, there is placed a substantially-ring-shaped plate 156b having an opening at a center part thereof and large cutouts formed in a periphery thereof. As shown in FIG. 11, on the substantially-ring-shaped plate 156b, there is placed a wafer boat 43 as a quartz product to be baked. Specifically, as shown in FIG. 10, a rotational shaft of the wafer boat 43 passes through the center opening of the plate 156b to be inserted near the center opening of the plate 155c, with a lower peripheral edge of the wafer boat 43 being in contact with and supported by the plate 156b.

As shown in FIG. 12 to 14, the plates 152c, 154c, 155c are provided with holes 152d, 154d, and 155d, respectively. Patterns (dimensions and/or positions) of these holes 152d, 154d, and 155d can be suitably designed in accordance with a gas flow and/or quartz products to be placed on the respective plates.

As shown in FIGS. 10 and 15, similar to the first embodiment, heat-shield plates 50 are disposed on the lid member 123 via support members 50a. Herein, as shown in FIG. 15, an outer diameter of the heat-shield plate 50 is smaller than an outer diameter of the first cylindrical body 151.

In this embodiment, as shown in FIG. 9, two connection ports 157 and 158 for fixing quartz products constituting a heat-processing apparatus are disposed on a lower end surface of the lid member 123 on which the jig 106 is placed. As shown in FIG. 10, a temperature sensor 49 extending upward in a vertical vessel 2 and including a thermocouple is inserted into the connection port 157. On the other hand, a support rod 80 including a feed member and a heating plate 8 fixed on an upper end thereof is inserted into the connection port 158. A cable 49a is connected to a proximal end of the temperature sensor 49. When the temperature sensor 49 is inserted into the connection port 157, the cable 49a is extended from a lower side of the connection port 157. Thus, the cable 49a can be prevented from being heated during a baking process. The heating plate 8 is positioned in a region surrounded by the second cylindrical body 152 and the heat-shield plates 50.

Next, a flow of a baking gas supplied into the vertical vessel 2 is described with reference to FIG. 10. Firstly, a baking gas supplied into the vertical vessel 2 flows downward along the wafer boat 43. The baking gas having passed through a region where the wafers W are held by the wafer boat 43 passes a clearance S (see, FIGS. 10, 12, 13, 14, and 15) formed between outer circumferential walls of the cylindrical bodies 151, 152, 154, 155 and 156, and an inner peripheral wall of the vertical vessel 2. Then, the baking gas flows into the jig 106 via the holes 151a, 152a, 154a, 155a, 156a, and 156c respectively formed in the circumferential walls of the first cylindrical body 151, the second cylindrical body 152, the third cylindrical body 154, the fourth cylindrical body 155, and the uppermost cylindrical body 156, or passes the jig 106 to again flow into the clearance S via the holes 151a, 152a, 154a, 155a, 156c (156a).

Figure 16:
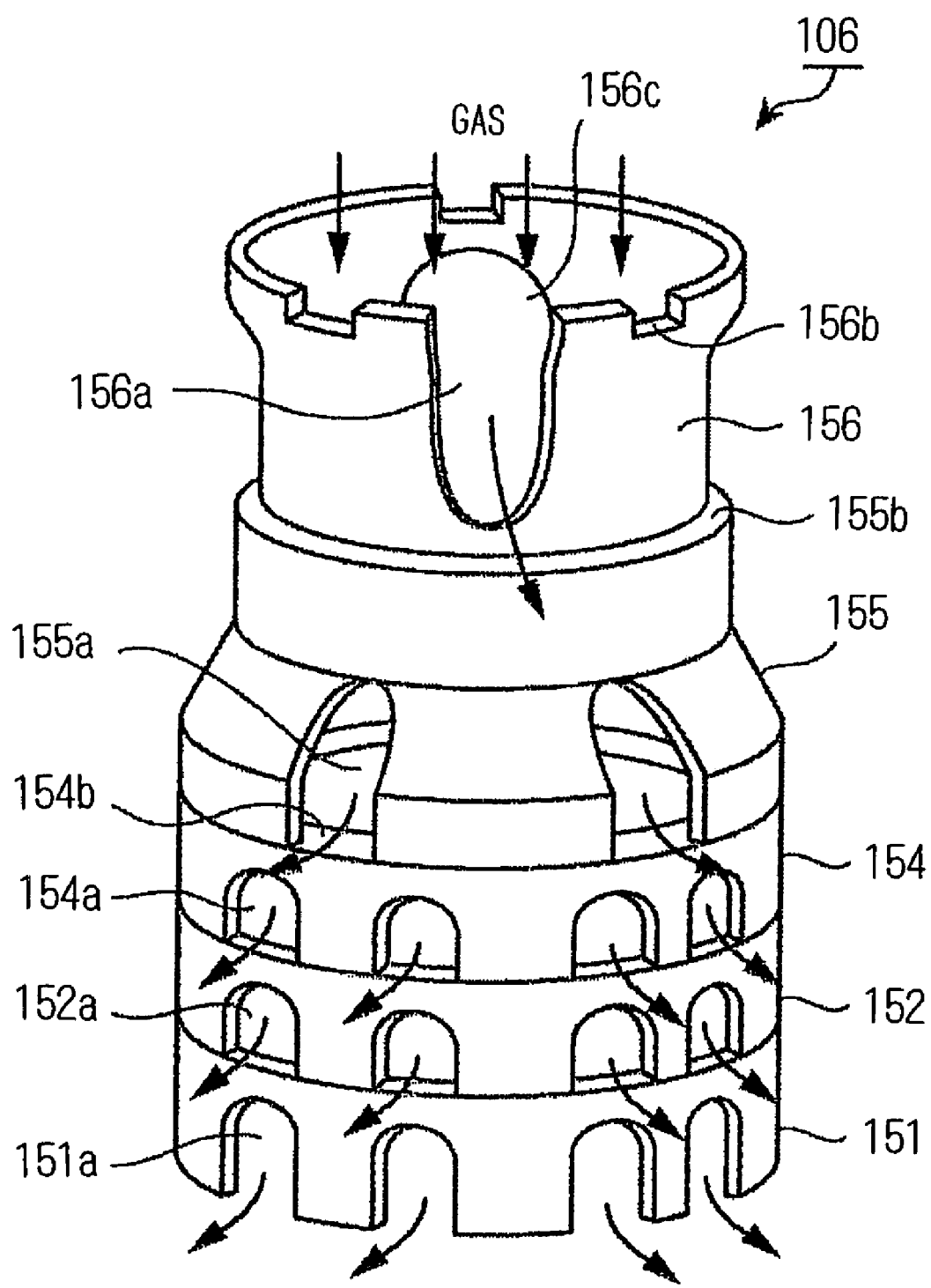
FIG. 16 is a view illustrating a flow of a gas through the baking jig shown in FIG. 8.

FIG. 16 is a view illustrating that the gas flows out of the holes 151a, 152a, 154a, 155a, 156c (156a) toward the clearance S. The baking gas having reached the lower end of the vertical vessel 2 passes through the clearance S to be discharged outside through the exhaust pipe 27 connected to the lower side surface of the vertical vessel 2.

According to the above-described second embodiment, the cylindrical bodies 151, 152, 154, 155 and 156, and the small articles as quartz products are sequentially stacked, and the wafer boat 43 is placed on the uppermost cylindrical body 156. Thus, a number of small articles and the wafer boat 43 as quartz products can be collectively baked with the jig of such a simple structure. In addition, the loading operation of the quartz products into the jig 106 and the unloading operation of the quartz products from the jig 106 are significantly easy. Since the holes 151a, 152a, 154a, 155a, and 156a (156c) are formed in the circumferential walls of the cylindrical bodies 151, 152, 154, 155, and 156, respectively, stagnation of the gas can be prevented so as to achieve smooth flow of the gas. As a result, the small articles and the wafer boat 43 placed on the cylindrical bodies 151, 152, 154, 155, and 156 can be uniformly baked. It is possible to carry out a baking process, with a part of the cylindrical bodies in the second embodiment being incorporated in the jig 6 in the first embodiment.

Figure 17:
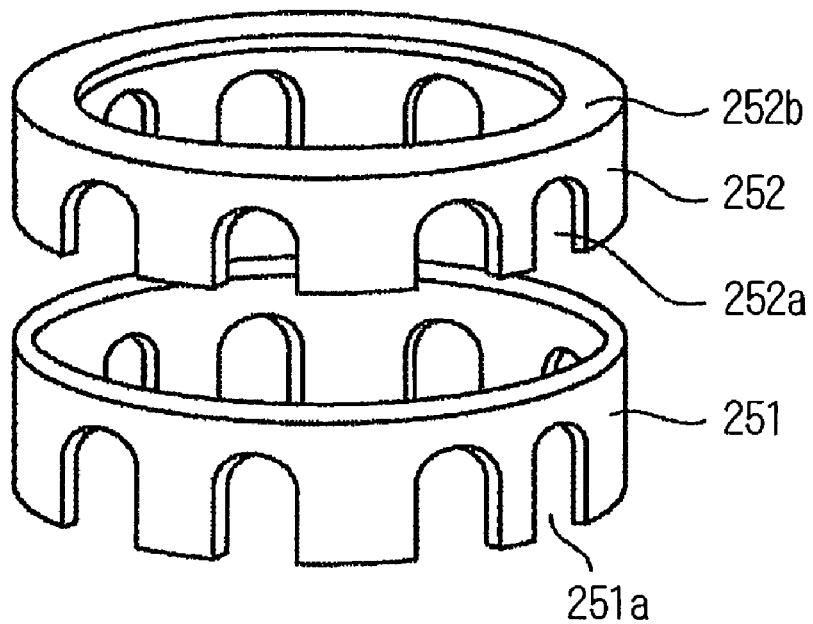
FIG. 17 is a schematic perspective view of a baking jig in still another embodiment of the present invention.
Figure 18:
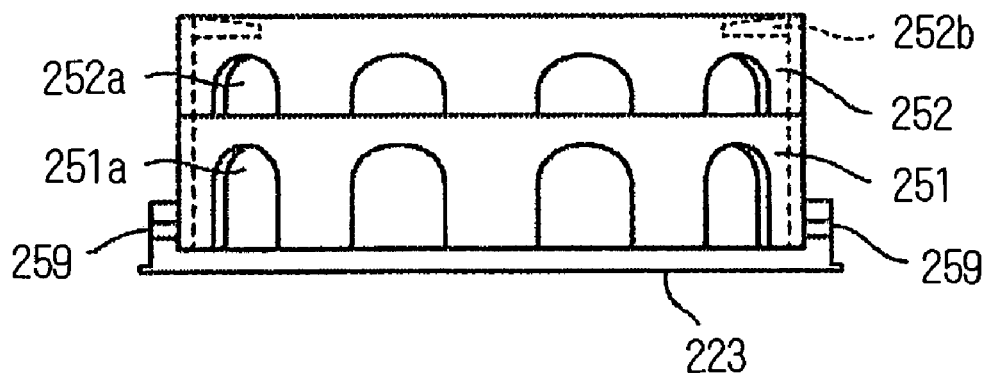
FIG. 18 is a schematic front view of the jig element shown in FIG. 17.

Next, another use of the baking jig will be described. In this example, as shown in FIG. 19, a plurality of temperature sensors 282 as quartz products are simultaneously subjected to a baking process by using cylindrical bodies 251 and 252 (identical to the cylindrical bodies 51 and 52 in constitution) shown in FIGS. 17 and 18.

Figure 19:
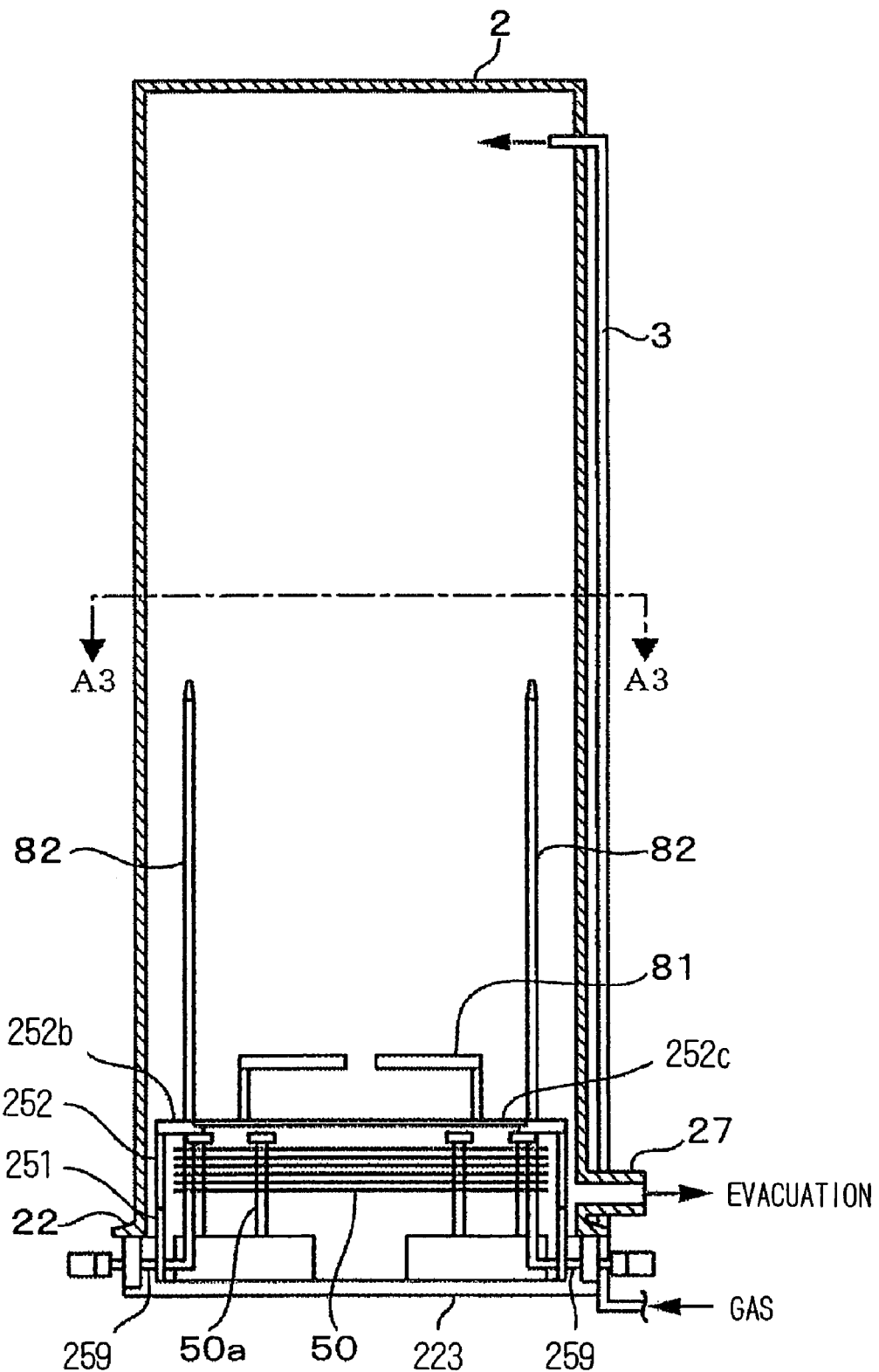
FIG. 19 is a view illustrating that the baking jig shown in FIG. 17 on which quartz products are placed is loaded in the baking apparatus.
Figure 20:
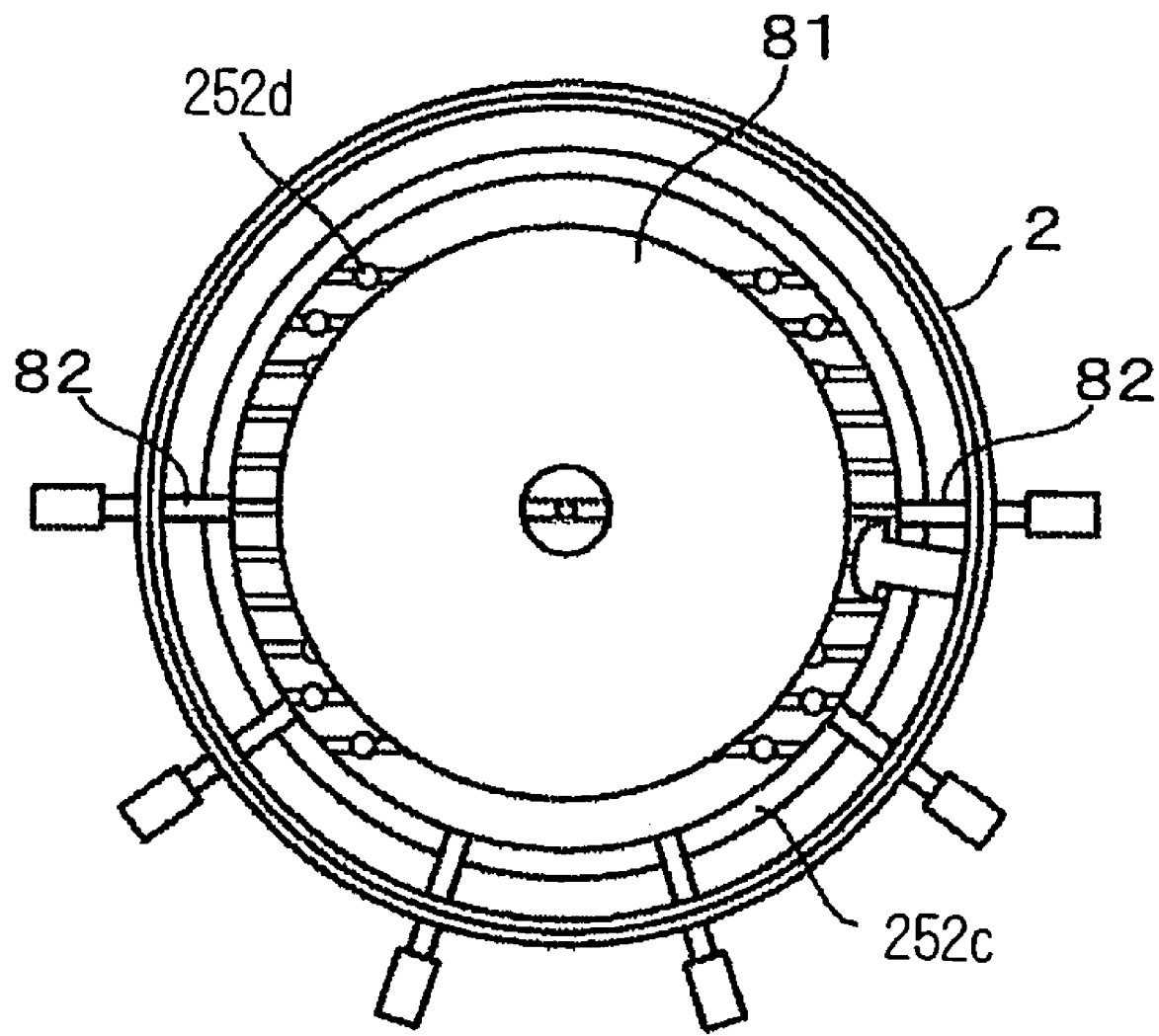
FIG. 20 is a sectional view taken along the line A3-A3 shown in FIG. 19.

As shown in FIG. 19, the temperature sensors 282 are inserted in connection ports 259 formed on a side surface of a lid member 223. As shown in FIG. 20, the plurality of connection ports 259 are formed in the side surface of the lid member 223. The respective temperature sensors 282 are inserted into these connection ports 259. FIG. 20 is a sectional view taken along the line A3-A3 in FIG. 19.

In the manner shown in FIG. 19, by using the cylindrical bodies 251 and 252 and a plate 252b, the plurality of temperature sensors 282 as quartz products together with a heat-insulation member 281 as a quartz product can be simultaneously baked. It is possible to flexibly determine a using manner of the baking jig with the cylindrical bodies 251 and 252.

The invention claimed is:

1. A quartz-product baking method for baking a first quartz product and a second quartz product to remove a metal contained therein, the first and second quartz products being to be loaded into a heat-processing apparatus for heat-processing a semiconductor substrate so that at least a part of each quartz product is brought into contact with a heat-processing atmosphere of the heat-processing apparatus, the quartz-product baking method comprising the steps of:
with the use of jig including a first jig element and a second jig element that are disengageably stacked in a tier-like manner, placing the first quartz product on the first jig element, stacking the second jig element on the first jig element, and placing the second quartz product on the second jig member;
placing on a lid member the jig in which the quartz products are placed in a tier-like manner, elevating the lid member to load the jig into a baking vertical vessel through a lower opening thereof, and hermetically sealing the lower opening of the baking vertical vessel with the lid member;
heating an atmosphere in the baking vertical vessel; and
supplying a baking gas containing a hydrogen chloride gas and a gas for enhancing reactivity of the hydrogen chloride gas, into the baking vertical vessel,
wherein each of the first jig element and the second jig element includes:
jig element bodies that can be stacked on each other; and
plates disposed on each of the jig element bodies, for placing thereon the quartz products, and
wherein the plate is provided with a hole for allowing a gas to pass therethrough.

2. The quartz-product baking method according to claim 1, wherein the plate is capable of being engaged with and disengaged from the jig element body.

3. The quartz-product baking method according to claim 1, wherein the jig element body is a cylindrical body.

4. The quartz-product baking method according to claim 3, wherein a plurality of gas-passing holes for allowing a gas to pass therethrough are formed in a peripheral wall of the jig element body in a circumferentially dispersed manner.

5. The quartz-product baking method according to claim 3, wherein the semiconductor is circular, and
a diameter of the jig element body is substantially the same as a diameter of the semiconductor substrate.

6. The quartz-product baking method according to claim 1, wherein a quartz product is placed on an uppermost jig element such that the quartz product projects upward from the uppermost jig element.

7. The quartz-product baking method according to claim 6, wherein, as a quartz product, a reaction vessel or a substrate holder of the heat-processing apparatus is placed on the uppermost jig element.

8. A quartz product that is to be loaded into a heat-processing apparatus for heat processing a semiconductor substrate so that at least a part of the quartz product is brought into contact with a heat-processing atmosphere of the heat-processing apparatus, the quartz product having been baked by the baking method according to claim 1.

9. A set of quartz products that is to be loaded into a heat-processing apparatus for heat-processing a semiconductor substrate so that at least a part of each quartz product is brought into contact with a heat-processing atmosphere of the heat-processing apparatus, the set of quartz products having been simultaneously baked by the baking method according to claim 1.

10. A quartz-product baking apparatus for baking a first quartz product and a second quartz product to remove a metal contained therein, the first and second quartz products being to be loaded into a heat-processing apparatus for heat-processing a semiconductor substrate so that at least a part of each quartz product is brought into contact with a heat-processing atmosphere of the heat-processing apparatus, the quartz-product baking apparatus comprising:
a jig including a first jig element and a second jig element that are disengageably stacked in a tier-like manner;
a lid member for placing thereon the jig and the quartz products, with the first quartz product being placed on the first jig element, the second jig element being stacked on the first jig element; and the second quartz product being placed on the second jig element;
a baking vertical vessel having a lower opening that is closed by the lid member; a
heating device for heating an atmosphere in the baking vertical vessel; and
a gas-supplying device for supplying a baking gas containing a hydrogen chloride gas and a gas for enhancing reactivity of the hydrogen chloride gas into the baking vertical vessel,
wherein each of the first jig element and the second jig element includes:
jig element bodies that can be stacked on each other; and
plates disposed on each of the jig element bodies, for placing thereon the quartz products, and
wherein the plate is provided with a hole for allowing a gas to pass therethrough.

11. The quartz-product baking apparatus according to claim 10,
wherein the plate is capable of being engaged with and disengaged from the jig element body.

12. The quartz-product baking apparatus according to claim 10,
wherein the jig element body is a cylindrical body.

13. The quartz-product baking apparatus according to claim 12,
wherein a plurality of gas-passing holes for allowing a gas to pass therethrough are formed in a peripheral wall of the jig element body in a circumferentially dispersed manner.

14. The quartz-product baking method according to claim 12, wherein the semiconductor is circular, and
a diameter of the jig element body is substantially the same as a diameter of the semiconductor substrate.

* * * * *